(12) United States Patent
Furukawa

(10) Patent No.: US 11,515,192 B2
(45) Date of Patent: Nov. 29, 2022

(54) SAMPLE HOLDER

(71) Applicant: KYOCERA Corporation, Kyoto (JP)

(72) Inventor: Naoki Furukawa, Kagoshima (JP)

(73) Assignee: KYOCERA Corporation, Kyoto (JP)

( * ) Notice: Subject to any disclaimer, the term of this patent is extended or adjusted under 35 U.S.C. 154(b) by 443 days.

(21) Appl. No.: 16/754,234

(22) PCT Filed: Oct. 23, 2018

(86) PCT No.: PCT/JP2018/039298
§ 371 (c)(1),
(2) Date: Apr. 7, 2020

(87) PCT Pub. No.: WO2019/082875
PCT Pub. Date: May 2, 2019

(65) Prior Publication Data
US 2020/0279765 A1    Sep. 3, 2020

(30) Foreign Application Priority Data
Oct. 26, 2017    (JP) .............................. JP2017-206974

(51) Int. Cl.
*H01L 21/683*    (2006.01)
*H01J 37/32*    (2006.01)

(52) U.S. Cl.
CPC .... *H01L 21/6833* (2013.01); *H01J 37/32715* (2013.01); *H01L 21/6831* (2013.01)

(58) Field of Classification Search
CPC .......................... H01L 21/6831; H01L 21/6833
See application file for complete search history.

(56) References Cited

U.S. PATENT DOCUMENTS

| | | | |
|---|---|---|---|
| 8,505,928 B2 * | 8/2013 | Saito ................. | H01L 21/67103 156/345.52 |
| 2005/0105243 A1 * | 5/2005 | Lee ..................... | H01L 21/6833 361/234 |
| 2006/0209490 A1 * | 9/2006 | Nakamura .......... | H01L 21/6831 361/234 |
| 2010/0065300 A1 * | 3/2010 | Miyashita ............. | H02N 13/00 427/454 |
| 2013/0279066 A1 | 10/2013 | Lubomirskyo et al. | |
| 2013/0308244 A1 | 11/2013 | Shiraiwa et al. | |

(Continued)

FOREIGN PATENT DOCUMENTS

| | | |
|---|---|---|
| JP | 3154629 U | 10/2009 |
| JP | 2010-123712 A | 6/2010 |

(Continued)

*Primary Examiner* — Gary A Nash
(74) *Attorney, Agent, or Firm* — Volpe Koenig

(57) ABSTRACT

A sample holder includes: a base body including a ceramic material; a support body including a metal material; a first joining layer which joins a lower face of the base body and an upper face of the support body together; a first through hole extending from a lower face of the support body through the first joining layer to the upper face of the base body, a part of the first through hole located within the base body being at least partly narrower than a part of the first through hole located within the support body and a part of the first through hole located within the first joining layer; and a porous member located inside the first through hole and joined to the lower face of the base body via a second joining layer.

13 Claims, 8 Drawing Sheets

(56) References Cited

U.S. PATENT DOCUMENTS

2015/0279714 A1    10/2015  Yamaguchi et al.
2016/0005639 A1*    1/2016  Ono ..................... C04B 37/026
                                                              361/234
2016/0276198 A1     9/2016  Anada et al.

FOREIGN PATENT DOCUMENTS

| JP | 2013-232641 A  |   | 11/2013 |
|----|----------------|---|---------|
| JP | 2013-243267 A  |   | 12/2013 |
| JP | 2014-209615 A  |   | 11/2014 |
| JP | 2015-517225 A  |   |  6/2015 |
| JP | 2015159232 A   | * |  9/2015 |
| JP | 2015-195346 A  |   | 11/2015 |
| JP | 2017-157726 A  |   |  9/2017 |

* cited by examiner

SAMPLE HOLDER

CROSS-REFERENCE TO RELATED APPLICATIONS

This application is a national stage entry according to 35 U.S.C. 371 of International Application No. PCT/JP2018/039298, filed on Oct. 23, 2018, which claims priority to Japanese Patent Application No. 2017-206974, filed on Oct. 26, 2017, the contents of which are entirely incorporated herein by reference.

TECHNICAL FIELD

The present disclosure relates to a sample holder.

BACKGROUND

For example, an electrostatic chuck described in Japanese Unexamined Patent Publication JP-A 2015-517225 (hereinafter referred to as Patent Literature 1) is known as a sample holder for use in a semiconductor manufacturing apparatus, etc. The electrostatic chuck described in Patent Literature 1 includes a dielectric layer and a metallic base portion disposed below the dielectric layer. The metallic base portion is provided with a through hole for cooling a wafer, and a porous member is disposed in the through hole.

SUMMARY

A sample holder according to the disclosure includes: a base body including a ceramic material and including a sample holding face which lies on an upper face of the base body; a support body including a metal material and including an upper face which faces a lower face of the base body; a first joining layer which joins the lower face of the base body and the upper face of the support body together; a first through hole extending from a lower face of the support body through the first joining layer to the upper face of the base body, a part of the first through hole located within the base body being at least partly narrower than a part of the first through hole located within the support body and a part of the first through hole located within the first joining layer; and a porous member located inside the first through hole and joined to the lower face of the base body via a second joining layer.

DETAILED DESCRIPTION

A sample holder 100 will now be described with reference to drawings.

Figure 1:
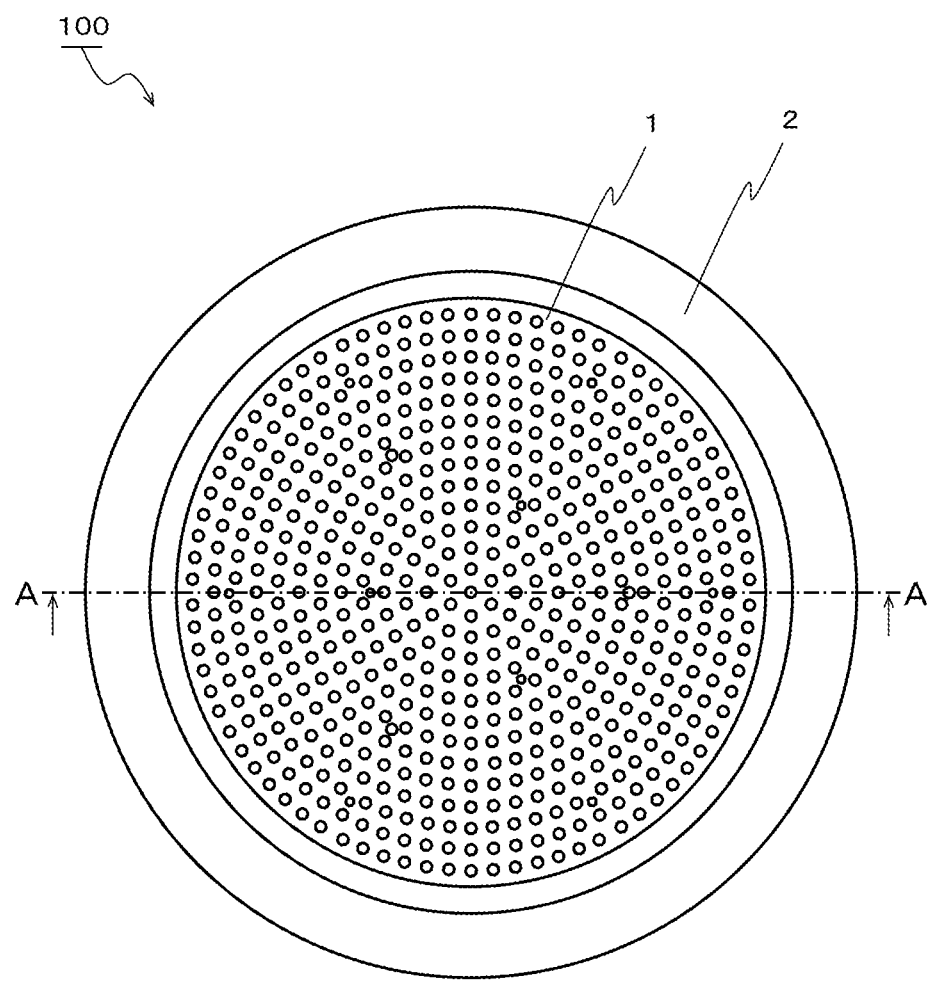
FIG. 1 is a top view showing an example of the sample holder.
Figure 2:
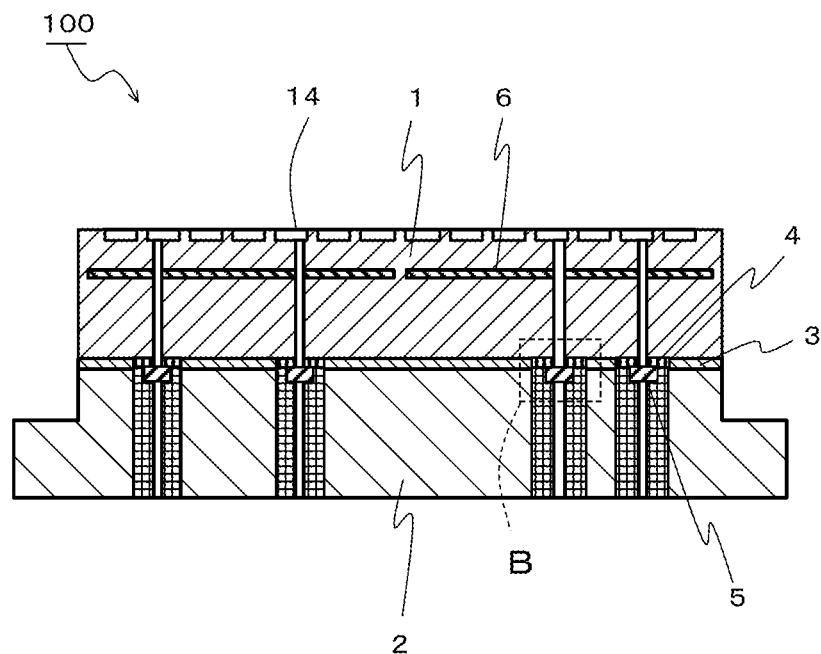
FIG. 2 is a sectional view of the sample holder shown in FIG. 1 taken along the line A-A.

As shown in FIGS. 1 and 2, the sample holder 100 includes a base body 1, a support body 2, a first joining layer 3, a second joining layer 4, and a porous member 5. The sample holder 100 according to an embodiment of the disclosure further includes an adsorption electrode 6. For example, the sample holder 100 is made as an electrostatic chuck. For example, the sample holder 100 is used in conditions where plasma is being produced above a sample holding face 14. Plasma can be produced by, for example, applying radio frequency between a plurality of external electrodes to excite gases present between the electrodes.

The base body 1 is a circular plate member. An upper face of the base body 1 serves as the sample holding face 14 for holding a sample. That is, the base body 1 holds a sample such as a silicon wafer on the upper face serving as the sample holding face 14. For example, the base body 1 includes a ceramic material. Examples of the ceramic material include alumina, aluminum nitride, silicon nitride, and yttria. For example, the dimensions of the base body 1 may be set to 200 to 500 mm in diameter and 2 to 15 mm in thickness.

Various methods may be used as a method for holding a sample using the base body 1. The sample holder 100 according to the embodiment holds a sample with electrostatic force. The sample holder 100 thus includes the adsorption electrode 6 disposed within the base body 1. The adsorption electrode 6 comprises two electrodes. One of the two electrodes is connected to the positive terminal of a power supply, whereas the other is connected to the negative terminal of the power supply. The two electrodes, each in the form of a substantially semicircular plate, are arranged inside the base body 1 such that the chords of their semicircular shapes are opposed to each other. The two electrodes are combined to provide the adsorption electrode 6 in the general form of a circle. The center of the circular outside shape of the entire adsorption electrode 6 may be brought into coincidence with the center of the circular outside shape of the base body 1. For example, the adsorption electrode 6 includes a metal material. Examples of the metal material include platinum, tungsten, and molybdenum.

The support body 2 is a member for supporting the base body 1. For example, the support body 2 is a circular plate member. For example, the support body 2 includes a metal material. For example, aluminum may be used as the metal material. The support body 2 and the base body 1 are joined together via the first joining layer 3. More specifically, an upper face of the support body 2 is bonded to a lower face of the base body 1 by the first joining layer 3. For example, a resin material may be used for the first joining layer 3. For example, a silicone adhesive may be used as the resin material.

Figure 3:
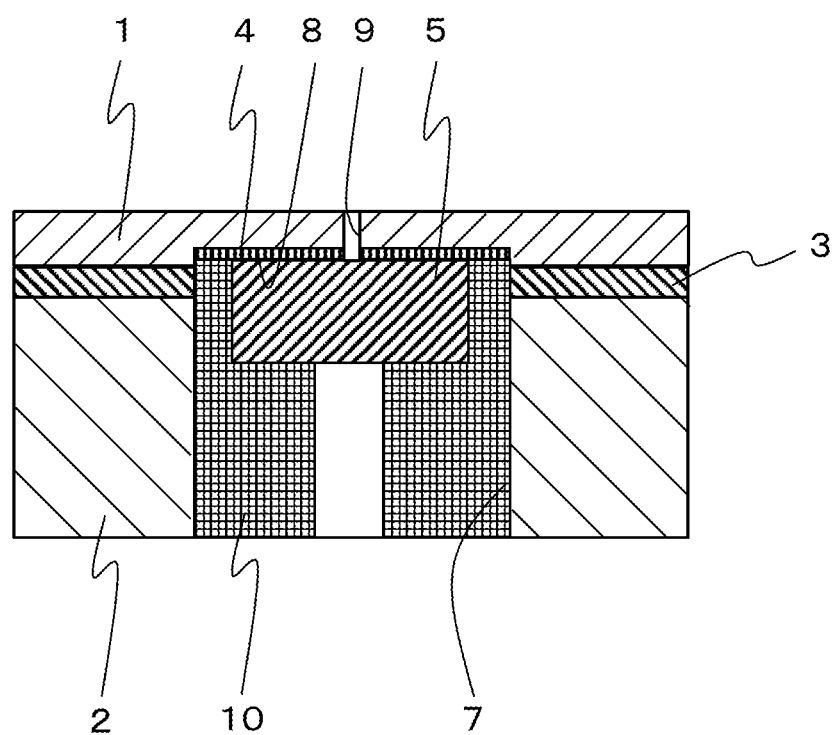
FIG. 3 is an enlarged fragmentary sectional view showing a region B of the sample holder shown in FIG. 2.

As shown in FIGS. 2 and 3, the base body 1, the first joining layer 3, and the support body 2 are configured to include a first through hole 7. For example, the first through hole 7 is provided for allowing gas such as a helium gas to flow toward the sample holding face 14. The first through hole 7 extends through from a lower face of the support body 2 through the first joining layer 3 to the upper face of the base body 1. A part of the first through hole 7 located within the base body 1 is at least partly narrower than a part of the first through hole 7 located within the support body 2, and a part of the first through hole 7 located within the first joining layer 3. In the sample holder 100 according to the embodiment, a part of the first through hole 7 which extends from the lower face to the upper face of the support body 2, as well as a part of the first through hole 7 which extends from a lower face to an upper face of the first joining layer 3, is shaped in a circular cylinder of uniform diameter. Moreover, the part of the first through hole 7 located within the base body 1 includes a cylindrical first recess 8 located at the lower face of the base body 1, and a cylindrical second through hole 9 which opens into a bottom face of the first recess 8 and into the upper face of the base body 1.

The porous member 5 is provided for preventing plasma generated above the sample holding face 14 from finding its way toward the support body 2 through the first through hole 7. For example, a ceramic material such as alumina may be used for the porous member 5. The porous member 5 is located inside the first through hole 7. The porous member 5 is joined to the lower face of the base body 1 via the second joining layer 4. More specifically, the second joining layer 4 joins the porous member 5 to the lower face of the base body 1 such that the second through hole 9 within the base body 1 remains unobstructed. In other words, for example, the second joining layer 4 has a hole which is continues with the second through hole 9 and penetrate the second joining layer 4 so as to extend across upper and lower faces thereof.

The porous member 5 has a porosity sufficient to permit the passage of gas from an upper face to a lower face of the porous member 5. Thus, the porous member 5 located inside the first through hole 7 permits the passage of gas through the first through hole 7 and yet reduces the possibility that plasma will reach the support body 2. For example, the porosity of the porous member 5 may be set to 40% to 60%.

The second joining layer 4 is a member for joining the porous member 5 to the lower face of the base body 1. For example, a resin material or a glass material may be used for the second joining layer 4. The second joining layer 4 is disposed in a region which may be exposed to plasma, and thus a high-plasma-resistant material may be used, in particular, for the second joining layer 4. Specifically, a glass material with calcium oxide or yttria added may be used. Alternatively, fluorine resin may be used.

In the sample holder 100 according to the embodiment, the porous member 5 is joined to the lower face of the base body 1 via the second joining layer 4. This makes it possible to fill the gap between the porous member 5 and the base body 1, and thus it is possible to reduce the possibility of arcing through a region between the porous member 5 and the base body 1.

As shown in FIG. 3, the part of the first through hole 7 located within the base body 1 includes the first recess 8 located at the lower face of the base body 1, and the second through hole 9 which opens into the bottom face of the first recess 8 and into the upper face of the base body 1. Moreover, the porous member 5 may be joined to the bottom face of the first recess 8. By joining the porous member 5 to the bottom face of the first recess 8, the upper face of the porous member 5 can be spaced upwards away from the support body 2. This makes it possible to increase insulation distance between the upper face of the porous member 5 and the support body 2. As a result, it is possible to reduce the possibility that arcing occurs between the support body 2 and the through hole through the upper face of the porous member 5.

The upper face of the porous member 5 may be positioned inside the first recess 8. In other words, the upper face of the porous member 5 may be positioned above the lower face of the base body 1. This makes it possible to further increase insulation distance between the upper face of the porous member 5 and the support body 2. As a result, the possibility of occurrence of arcing can be further reduced.

The sample holder 100 may further include an insulating tubular member 10 located inside the first through hole 7, the insulating tubular member 10 covering part of the lower face of the porous member 5 and at least part of the outer peripheral face of the porous member 5, and extending along the first through hole 7. This makes it possible to reduce the possibility that arcing occurs between the support body 2 and a part of the first through hole 7 located below the porous member 5.

For example, a ceramic material may be used for the tubular member 10. Examples of the ceramic material include alumina and aluminum nitride. The tubular member 10 includes a stepped inner peripheral face. In other words, an upper end of the tubular member 10 is increased in an inside diameter thereof. This enables the tubular member 10 and the porous member 5 to fit one another.

Figure 4:
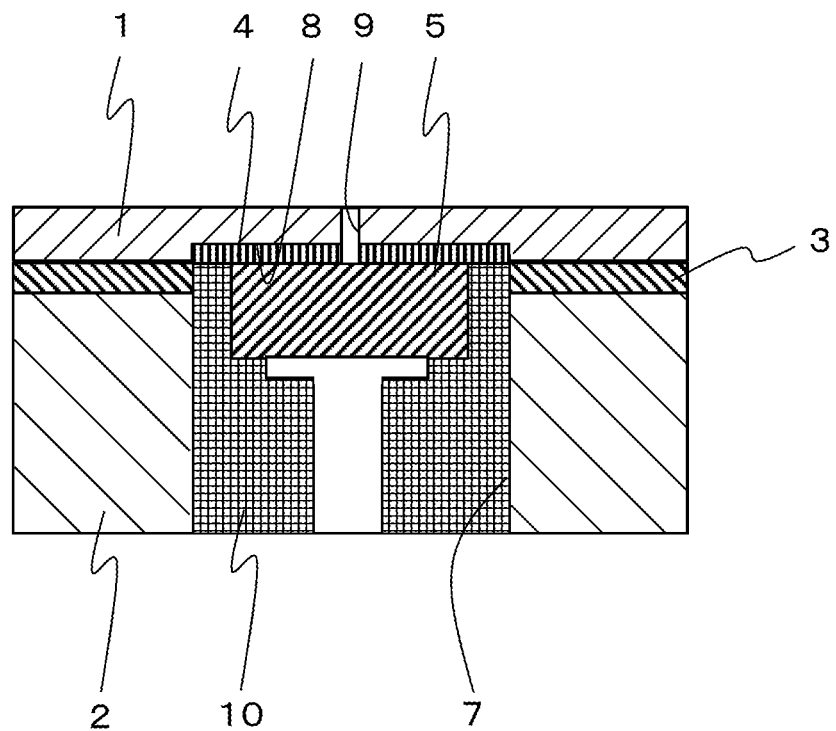
FIG. 4 is a fragmentary sectional view showing another example of the sample holder.

Moreover, as shown in FIG. 4, an inside diameter of a face of the tubular member 10 in contact with the lower face of the porous member 5, may be larger than an inside diameter of a lower end of the tubular member 10. This makes it possible to allow gas inside the tubular member 10 to flow smoothly through the porous member 5 toward the sample holding face 14. As a result, long-term reliability of the porous member 5 and the tubular member 10 can be improved.

Figure 5:
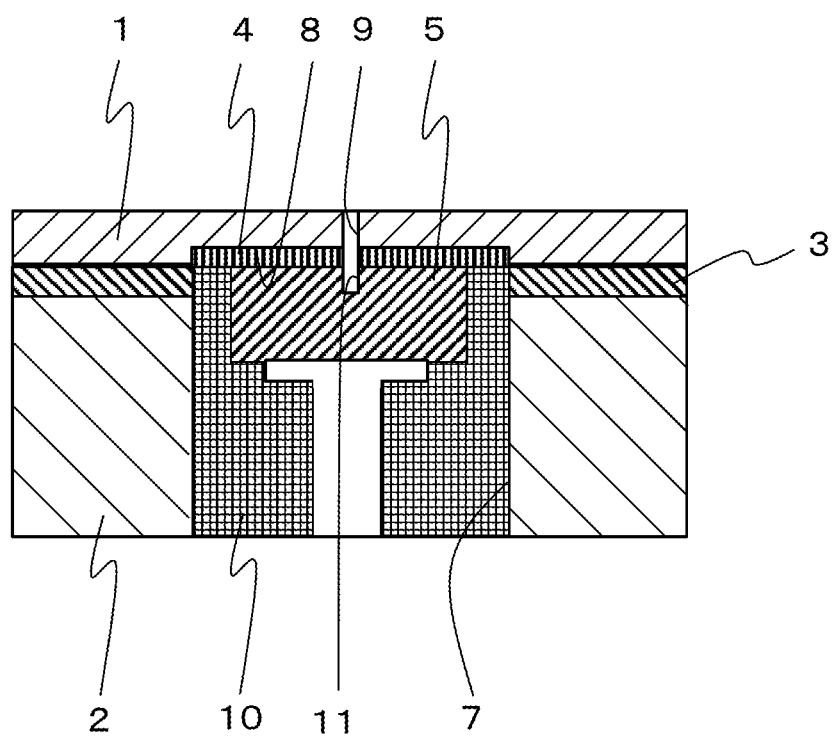
FIG. 5 is a fragmentary sectional view showing still another example of the sample holder.

Moreover, as shown in FIG. 5, the porous member 5 and the second joining layer 4 may be configured to include a second recess 11 including an inner peripheral face being continuous with the part of the first through hole 7 located within the base body 1. By providing the porous member 5 with the second recess 11, it is possible to increase the surface area of a region of the porous member 5 which communicates with the part of the first through hole 7 located within the base body 1. This makes it possible to allow gas to flow smoothly from the porous member 5 toward the part of the first through hole 7 located within the base body 1.

Figure 6:
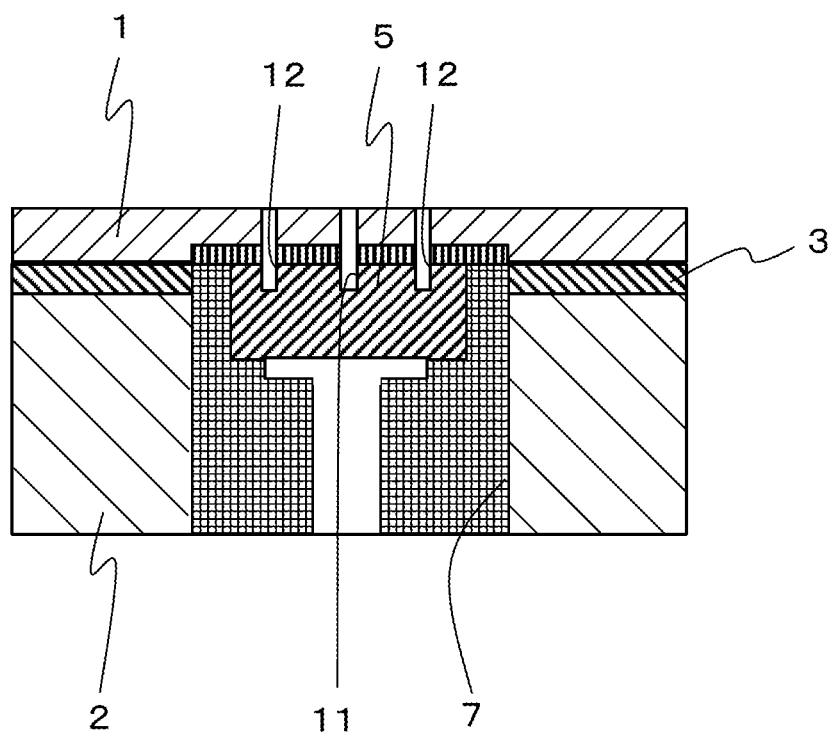
FIG. 6 is a fragmentary sectional view showing still another example of the sample holder.

As shown in FIG. 6, the sample holder may further include a third recess 12 extending from the upper face of the base body 1 through the second joining layer 4 to the porous member 5. This makes it possible to distribute pressure during the passage of gas from the porous member 5 to the sample holding face 14. This makes it possible to allow the gas to flow more smoothly. Either a single third recess 12 or a plurality of third recesses 12 may be provided.

Figure 7:
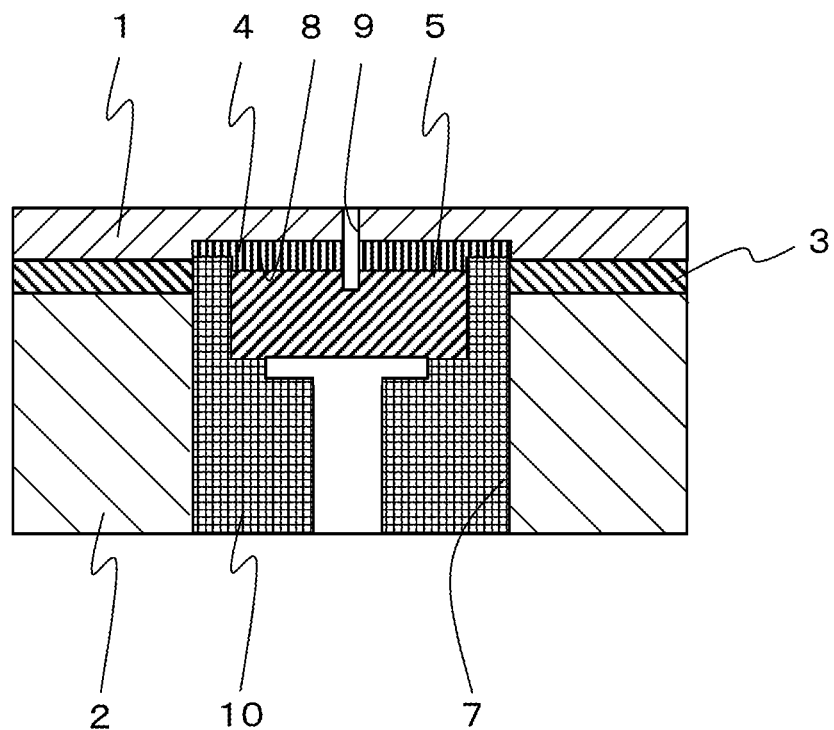
FIG. 7 is a fragmentary sectional view showing still another example of the sample holder.

Moreover, as shown in FIG. 7, an upper end of the tubular member 10 may be positioned above the upper face of the porous member 5. In this case, since the tubular member 10 is located between an upper end face of the porous member 5 and the support body 2, this makes it possible to reduce the possibility of arcing on the support body 2 along the upper end face of the porous member 5.

Figure 8:
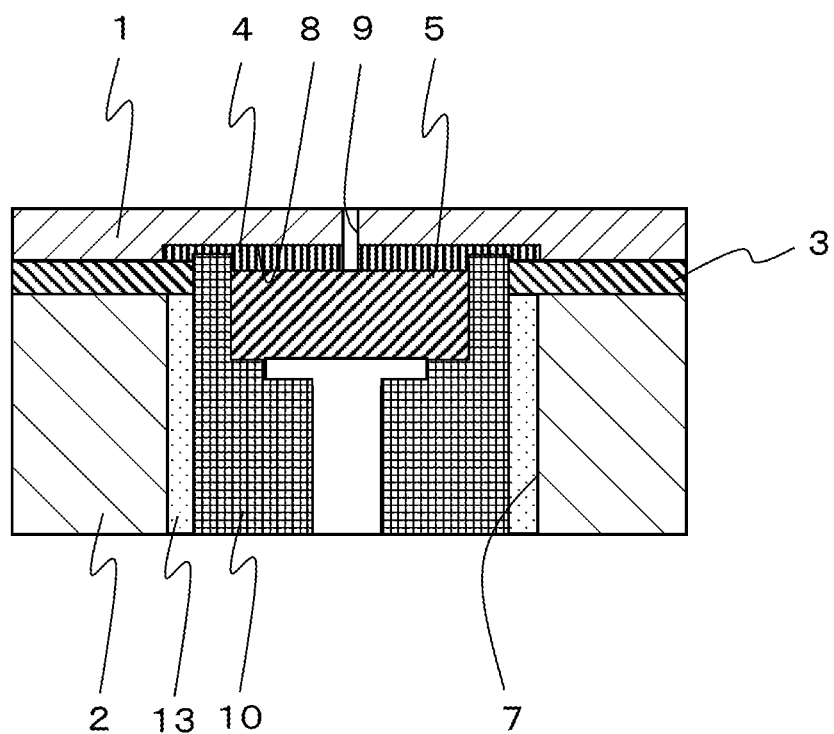
FIG. 8 is a fragmentary sectional view showing still another example of the sample holder.

As shown in FIG. 8, the sample holder may further include a third joining layer 13 disposed between the tubular member 10 and the support body 2. For example, a resin material such as silicone resin or epoxy resin may be used for the third joining layer 13. By providing the third joining layer 13, it is possible to reduce the possibility that the tubular member 10 will become misaligned due to thermal stress generated between the tubular member 10 and the support body 2 under heat cycles.

Figure 9:
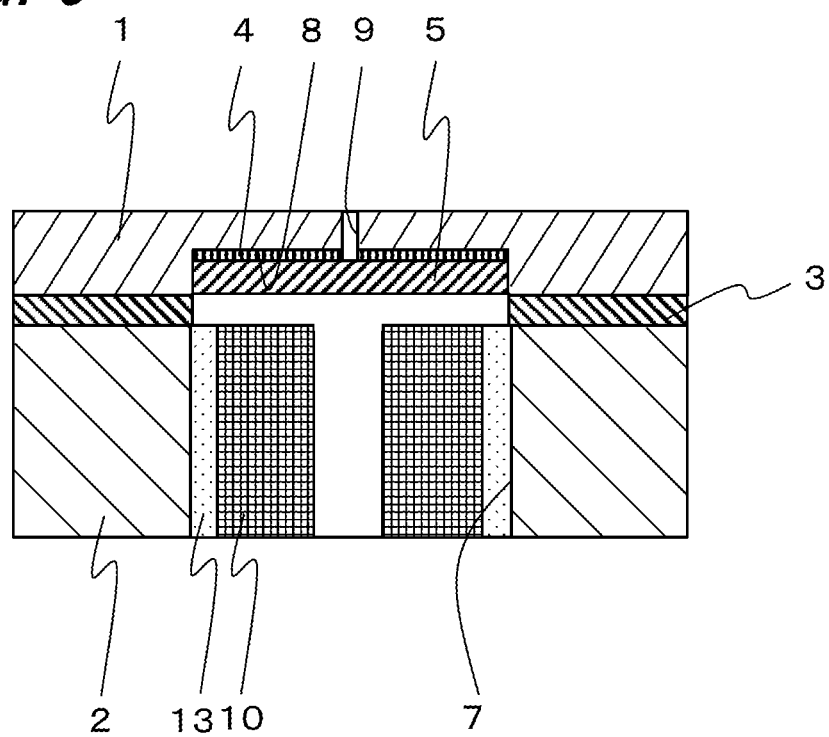
FIG. 9 is a fragmentary sectional view showing still another example of the sample holder.

Moreover, as shown in FIG. 9, the porous member 5 may be located entirely inside the first recess 8. In other words, the lower face of the porous member 5 may be positioned above the opening face of the first recess 8, or the lower face of the porous member 5 and the opening face of the first recess 8 may be flush with each other. This can make the porous member 5 less prone to being influenced by thermal expansion in the support body 2. As a result, long-term reliability of the sample holder 100 can be improved.

In this case, additionally, the porous member 5 and the tubular member 10 may be located apart from each other. This makes it possible to reduce the possibility of generation of thermal stress between the tubular member 10 and the porous member 5. As a result, long-term reliability of the sample holder 100 can be improved.

REFERENCE SIGNS LIST

1: Base body
2: Support body
3: First joining layer
4: Second joining layer
5: porous member
6: Adsorption electrode
7: First through hole
8: First recess
9: Second through hole
10: Tubular member
11: Second recess
12: Third recess
13: Third joining layer
100: Sample holder

The invention claimed is:

1. A sample holder, comprising:
a base body including a ceramic material and comprising a sample holding face which lies on an upper face of the base body;
a support body including a metal material and comprising an upper face which faces a lower face of the base body;
a first joining layer which joins the lower face of the base body and the upper face of the support body together;
a first through hole extending from a lower face of the support body through the first joining layer to the upper face of the base body, a part of the first through hole located within the base body being at least partly narrower than a part of the first through hole located within the support body and a part of the first through hole located within the first joining layer; and
a porous member located inside the first through hole and joined to the lower face of the base body via a second joining layer.

2. The sample holder according to claim 1,
wherein the part of the first through hole located within the base body comprises a first recess located at the lower face of the base body, and a second through hole which opens into a bottom face of the first recess and into the upper face of the base body; and
the porous member is joined to the bottom face of the first recess.

3. The sample holder according to claim 2,
wherein the porous member is located entirely inside the first recess.

4. The sample holder according to claim 2, further comprising:
an insulating tubular member located inside the first through hole, the insulating tubular member covering part of a lower face of the porous member and at least part of an outer peripheral face of the porous member, and extending along the first through hole.

5. The sample holder according to claim 4,
wherein an inside diameter of a face of the insulating tubular member in contact with the lower face of the porous member is larger than an inside diameter of a lower end of the insulating tubular member.

6. The sample holder according to claim 4,
wherein an upper end of the insulating tubular member is positioned above an upper face of the porous member.

7. The sample holder according to claim 4,
wherein the porous member and the insulating tubular member are located apart from each other.

8. The sample holder according to claim 1, further comprising:
an insulating tubular member located inside the first through hole, the insulating tubular member covering part of a lower face of the porous member and at least part of an outer peripheral face of the porous member, and extending along the first through hole.

9. The sample holder according to claim 8,
wherein an inside diameter of a face of the insulating tubular member in contact with the lower face of the porous member, is larger than an inside diameter of a lower end of the insulating tubular member.

10. The sample holder according to claim 8,
wherein an upper end of the insulating tubular member is positioned above an upper face of the porous member.

11. The sample holder according to claim 8,
wherein the porous member and the insulating tubular member are located apart from each other.

12. The sample holder according to claim 1,
wherein the porous member and the second joining layer are configured to include a second recess comprising an inner peripheral face being continuous with the part of the first through hole located within the base body.

13. The sample holder according to claim 1, further comprising:
a third recess extending from the upper face of the base body through the second joining layer to the porous member.

* * * * *